(12) United States Patent
Kim

(10) Patent No.: US 6,718,627 B2
(45) Date of Patent: Apr. 13, 2004

(54) BACK-UP PLATE UP/DOWN APPARATUS

(75) Inventor: Hyo Won Kim, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 10/298,534

(22) Filed: Nov. 19, 2002

(65) Prior Publication Data

US 2003/0095387 A1 May 22, 2003

(30) Foreign Application Priority Data

Nov. 22, 2001 (KR) .................................. 10-2001-0072850

(51) Int. Cl.$^7$ .......................... B23P 19/00; B65G 29/00
(52) U.S. Cl. ............................ 29/760; 29/729; 29/759; 198/473.1; 198/803.3; 198/803.7; 901/9; 901/46; 901/47; 269/169
(58) Field of Search .......................... 29/729, 744, 740, 29/759, 760, 407.04, 720; 198/803.11, 473.1, 803.3, 803.7; 901/9, 10, 33, 46, 47; 269/90, 166, 170

(56) References Cited

U.S. PATENT DOCUMENTS

| | | | | |
|---|---|---|---|---|
| 5,218,753 A | * | 6/1993 | Suzuki et al. | 29/740 |
| 5,964,031 A | * | 10/1999 | Smith et al. | 29/832 |
| 6,182,819 B1 | * | 2/2001 | Rehm | 198/803.11 |
| 6,331,225 B1 | | 12/2001 | Sugiyama | 156/299 |
| 6,438,822 B1 | * | 8/2002 | Hattori | 29/739 |
| 2003/0095387 A1 | * | 5/2003 | Kim | 361/741 |

* cited by examiner

Primary Examiner—Carl J. Arbes
Assistant Examiner—Minh Trinh
(74) Attorney, Agent, or Firm—Fleshner & Kim, LLP (57) ABSTRACT

The present invention discloses a back-up plate up/down apparatus in which a back-up plate is ascended or descended without rocking, maintaining a parallel state. The back-up plate up/down apparatus includes a base plate; guide blocks installed with a constant distance to the base plate; a first driving cylinder installed between the guide blocks; fixed blocks installed with a constant distance to both ends of the base plate and having rotating shafts inserted to both ends thereof; rotating links, in which the rotating shaft is inserted to an end thereof and a connecting member is connected to the other end thereof; a second driving cylinder connected to the connecting members by means of a rod; holders fixed at rods of other connecting members slidably and for fixing the back-up plate; and sensors installed to the holders with a constant distance.

9 Claims, 7 Drawing Sheets

FIG. 1

Prior Art

FIG. 2

Prior Art

BACK-UP PLATE UP/DOWN APPARATUS

BACKGROUND OF THE INVENTION

1. Field of the Invention

The present invention relates to a back-up plate up/down apparatus, more particularly, to a back-up plate up/down apparatus in which a back-up plate is ascended or descended without rocking, maintaining a parallel state.

2. Description of the Background Art

A large number of electronic components are mounted on a surface of a printed circuit board in order to be connected with each other electrically. The mounting of the electronic components is performed by a surface mounting apparatus, and the mounting of the electronic components comprises the steps of: supplying a printed circuit board(hereinafter, referred to a "board"); transferring the supplied board; mounting the electronic components on the board; and carrying out the board mounted the electronic components.

Figure 1:
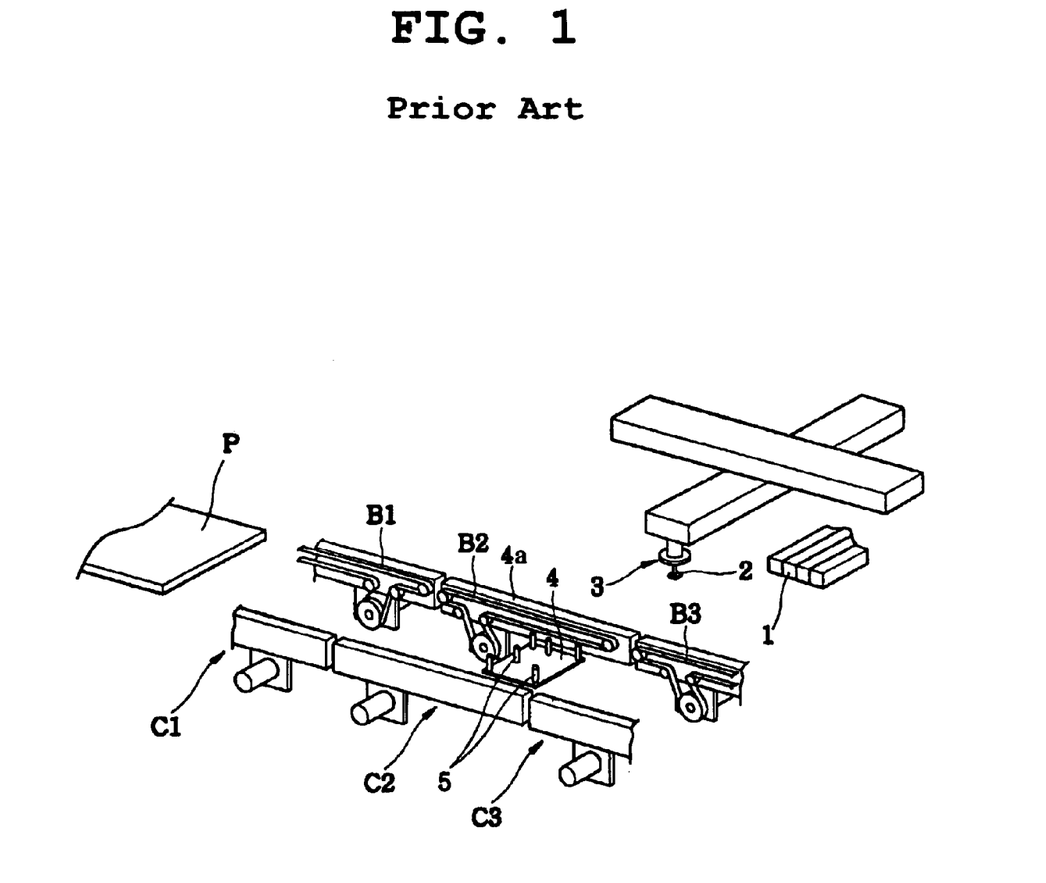
FIG. 1 is a view illustrating a construction of the electronic components mounting apparatus according to a conventional art.

As shown in FIG. 1, the mounting apparatus of electronic components according to the conventional art comprises: a plurality of conveyors C1, C2 and C3 arranged in a line for transferring the board P; an electronic components supplying unit 1 installed to at least one side of the conveyor C2 being mounted the electronic components among the plurality of conveyors C1, C2 and C3 and loaded the electronic components; a mounting head 3 for mounting the electronic components 2 to the board P by picking the electronic components 2 from the electronic components supplying unit 1.

The conveyors C1, C2 and C3 have belts B1, B2 and B3 being mounted on a side thereof at regular intervals.

A first conveyor C1 among the conveyors C1, C2 and C3 is a carry-in buffer conveyor being for carrying-in the board, a third conveyor C3 is a carry-out buffer conveyor for carrying-out the board mounted the electronic components, and a second mounting conveyor C2 between the first and third buffer conveyors is for mounting the electronic components. The respective conveyors C1, C2 and C3 are installed to a frame 4a and also driven independently by a driving means, respectively.

The mounting head 3 is moved at X and Y shafts by gantries of X and Y shafts and sucks the electronic components in the electronic components providing unit 1 by vacuum, thereby mounting the electronic components to the board.

On the other hand, only the both sides of the board P is supported by belts, so that there may be occurred a bending transformation being bent its central portion downwardly. That is, the central portion of the board P is bent downwardly by a load applied when mounting the electronic components and so the electronic components may be escaped from its mounting position.

In order to prevent from occurring the above wrong phenomenon, an apparatus comprises a supporting means for supporting the board P transferred from a lower portion of a mounting area of the electronic components to the mounting area.

The board supporting means comprises: a back-up plate 4; a plurality of back-up pins 5 installed on a top surface of the back-up plate 4 and contacted with a bottom surface of the board P for supporting the board P; and an up/down means (not shown) installed to a lower side of the back-up plate 4 for moving the back-up plate 4 upwardly/downwardly.

Figure 2:
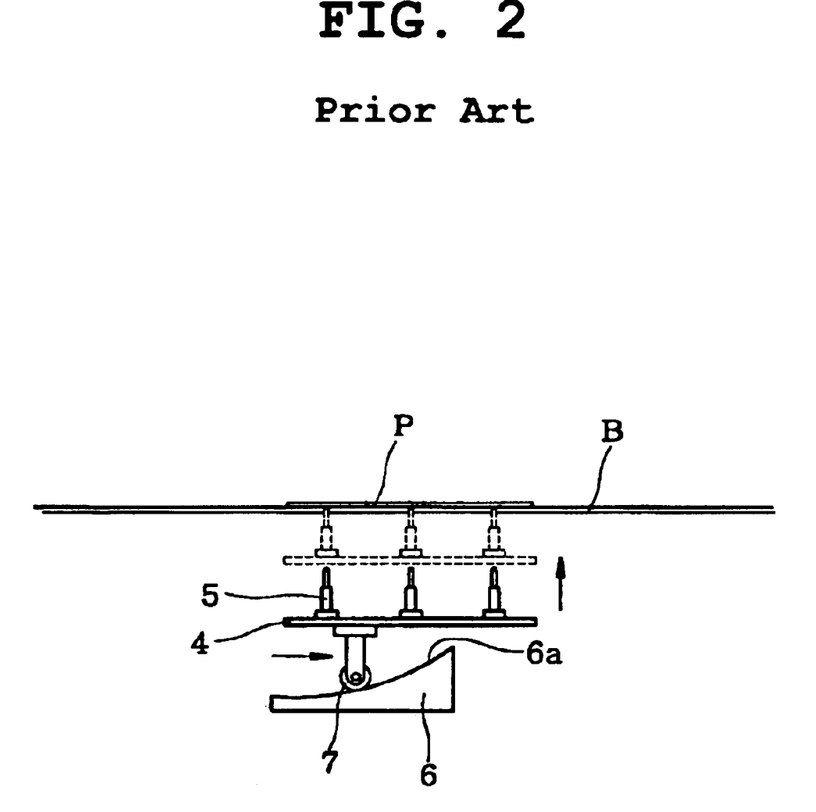
FIG. 2 is a side view illustrating an up/down apparatus of a back-up plate according to a conventional art.

As shown in FIG. 2, the up/down means comprises: an up/down guide 6 installed to the lower side of the back-up plate 4 and having an inclination surface 6a inclined upwardly toward one direction; and an up/down roller 7 capable of rolling along the inclination surface 6a of the up/down guide 6. That is, when the up/down roller 7 rolls along the inclination surface 6a, the height of the up/down roller 7 changes according to the change of height of the inclination surface and so the back-up plate 4 is moved upwardly and downwardly.

As constructed above, an operation of the electronic components mounting apparatus according to the conventional art will be described as follows.

The board carried by the first conveyor C1 is transferred to the second conveyor C2 as the mounting area, when the board is transferred to the second conveyor C2, the transfer of the board P is stopped temporarily by a stopper(not shown) and then a board support means of a lower side of the board is operated.

The up/down roller 7 rolls and ascends along the inclination surface 6a of the up/down guide 6 and so the back-up plate 4 is moved upwardly and the back-up pin 5 supports the board at a lower side.

In the state that the board is supported, the mounting head 3 is moved toward X and Y shaft directions and so the electronic components are mounted to the board by the mounting head 3.

When completing the mounting work, the stopper blocking the progress of the board is descended and simultaneously, the up/down roller 7 is moved downwardly along the inclination surface 6a, so that the back-up pin 5 is detached from the bottom surface of the board P.

The board mounted the electronic components by the third conveyor C is carried out and a new board is transferred to the second conveyor.

However, in the back-up plate up/down apparatus of the electronic components mounting apparatus according to a conventional art, several problems exist as follows.

The up/down roller 7 for moving the back-up plate 4 upwardly and downwardly is worn away partly according to the passing of a year and also when processing the inclination surface 6a, because its surface may be uneven, the back-up plate 4 does not smoothly move upwardly and downwardly and is rocked. Also, the degree of the up/down of the back-up plate 4 according to the inclination surface 6a of the up/down guide 6 is determined and the processing of the inclination surface 6a is difficult.

SUMMARY OF THE INVENTION

Accordingly, it is a primary object of the present invention to provide a back-up plate up/down apparatus in which the back-up plate supporting a board at a lower side is smoothly moved upwardly and downwardly.

Another object of the present invention is to provide a back-up plate up/down apparatus in which the board can be supported without settling a board minutely and rocking components.

In one aspect of the present invention, to achieve the above-described objects of the invention, there is provided a back-up plate up/down apparatus including: a base plate; a plurality of guide blocks installed with a constant distance to the base plate; one or more first driving means installed between the guide blocks; fixed blocks installed with a constant distance to both ends of the base plate and having rotating shafts inserted to both ends thereof; a plurality of rotating links, the respective rotating link in which the rotating shaft is inserted to an end thereof and a connecting member is connected to the other end thereof; a second driving means connected to the connecting members by means of a rod; at least one or more holders fixed at rods of other connecting members slidably and for fixing the back-up plate; and a plurality of sensors installed to the holders with a constant distance.

Preferably, the first and second driving means are pneumatic cylinders.

More preferably, the first driving means is a motor.

More preferably, a key may be installed to a connecting portion of the rotation link and the rotating shaft in order to prevent from clamping and distorting the rotation shaft.

More preferably, the guide block is installed to a lower side of the holder and guides the vertical direction movement of the back-up plate.

More preferably, an elastic means and a buffer means may be installed between the guide block and the holder.

BRIEF DESCRIPTION OF THE DRAWINGS

The present invention will become better understood with reference to the accompanying drawings which are given only by way of illustration and thus are not limitative of the present invention, wherein:

FIGS. 5a to 6b are views illustrating operating states of an up/down apparatus of a back-up plate according to the present invention;

DETAILED DESCRIPTION OF THE PREFERRED EMBODIMENTS

An up/down apparatus of a back-up plate in accordance with preferred embodiments of the present invention will now be described in detail with reference to the accompanying drawings.

Figure 3:
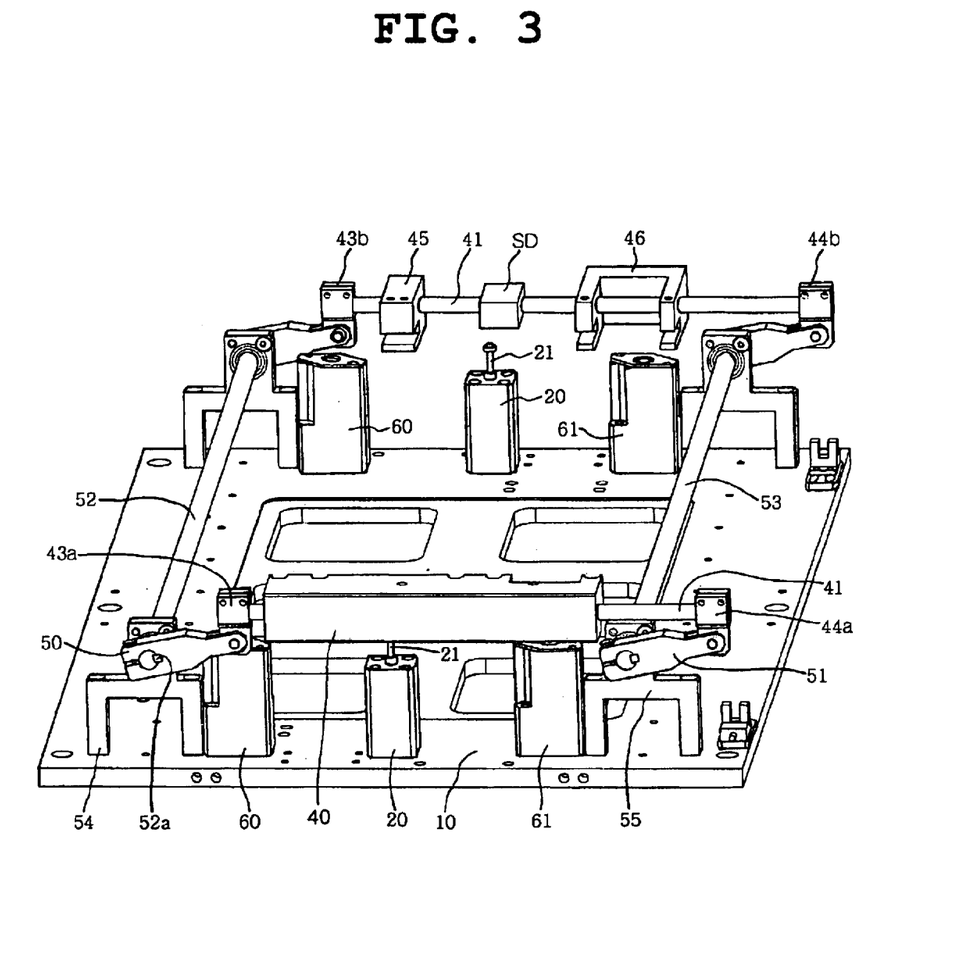
FIG. 3 is a perspective view illustrating an up/down apparatus of a back-up plate according to the present invention.
Figure 4:
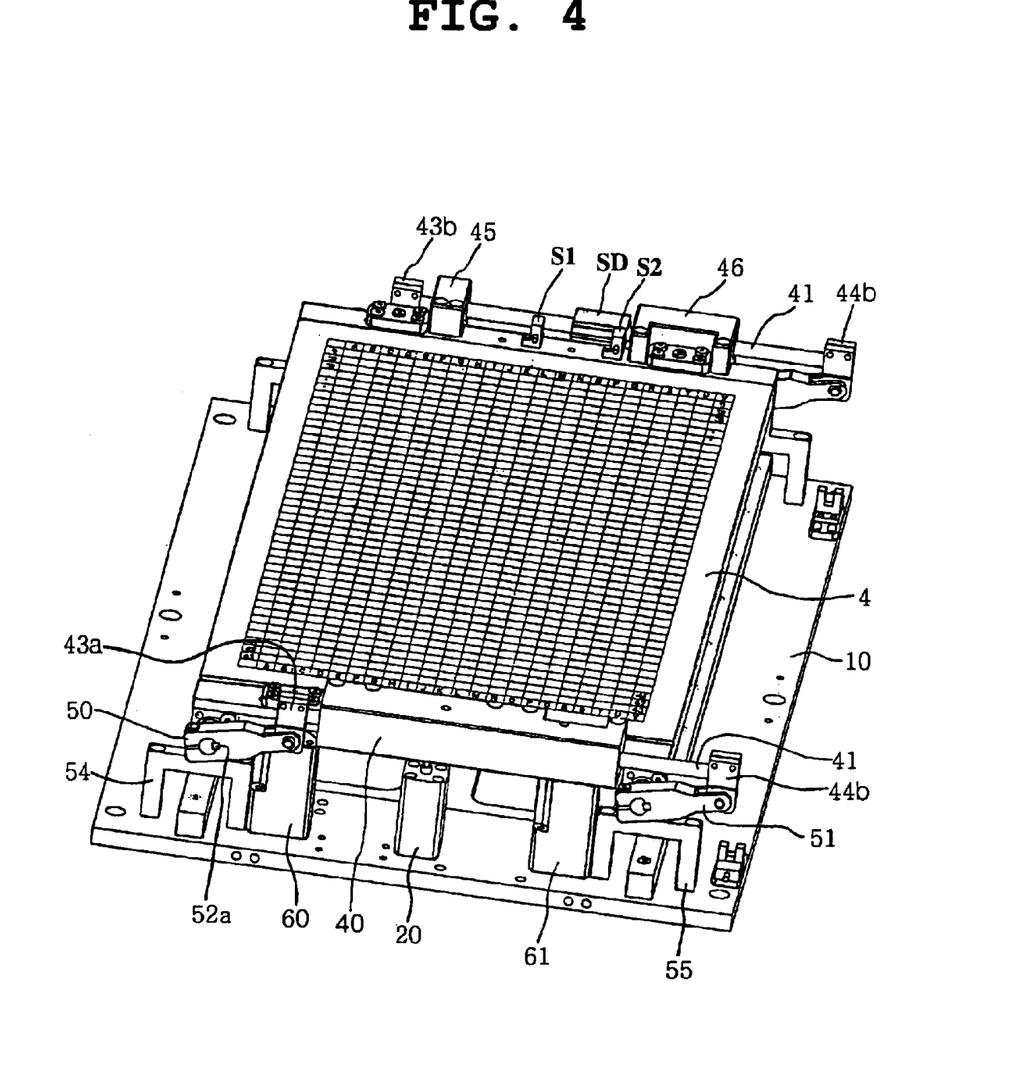
FIG. 4 is a perspective view illustrating a state that a back-up plate is mounted to an up/down apparatus of a back-up plate according to the present invention.
Figure 5A:
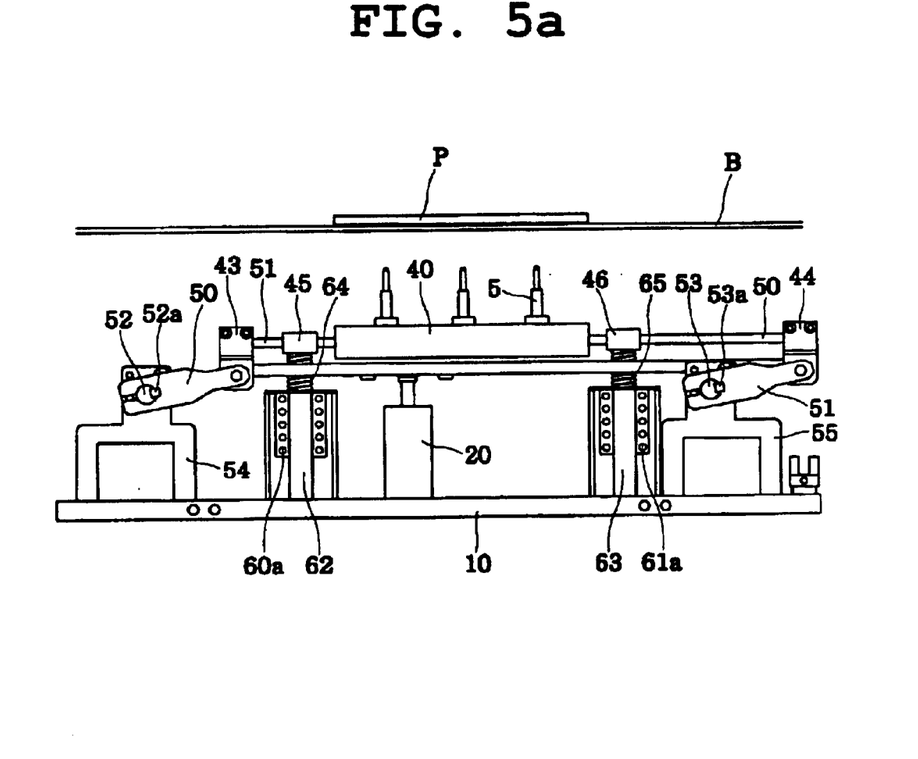
FIGS. 5a and 5b are views illustrating a state that a back-up plate is moved downwardly.
Figure 5B:
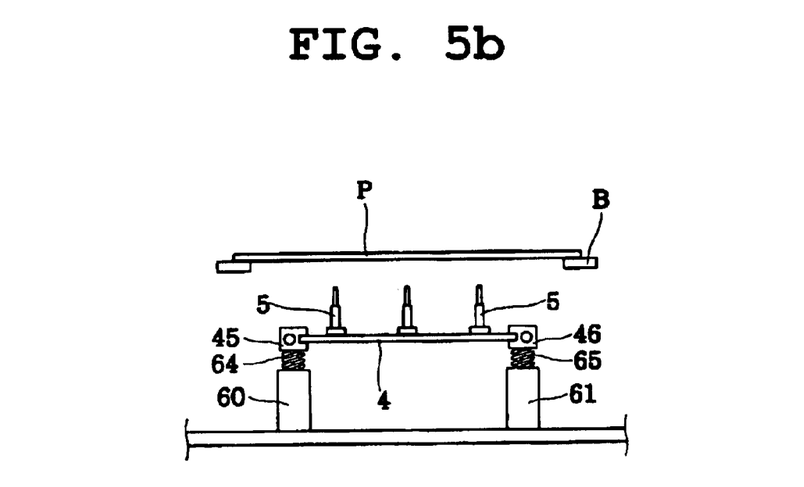
Figure 6A:
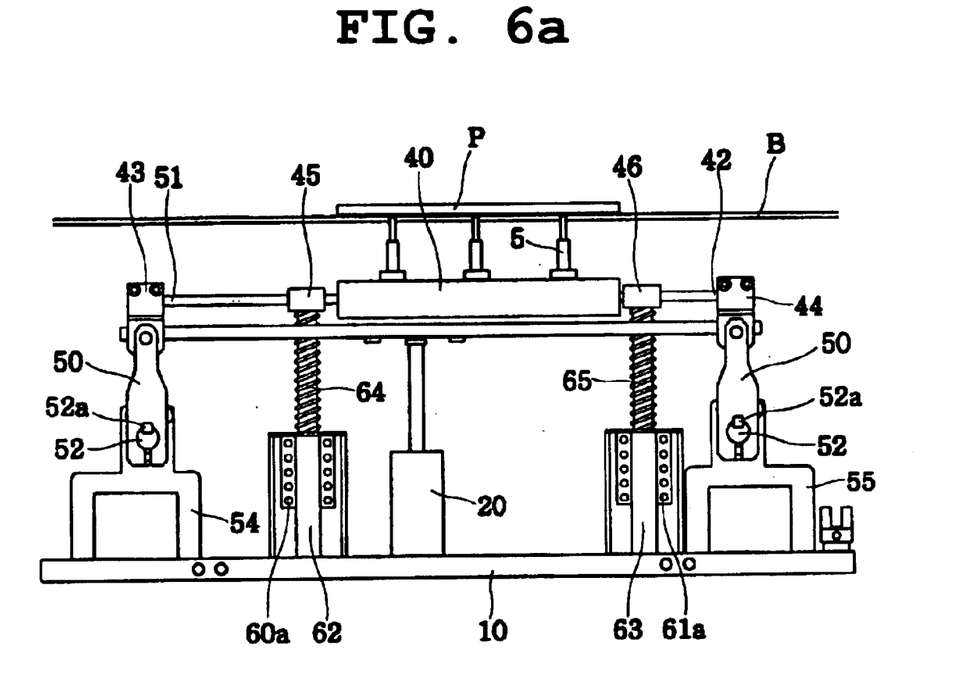
FIGS. 6a and 6b are views illustrating a state that a back-up plate is moved upwardly.
Figure 6B:
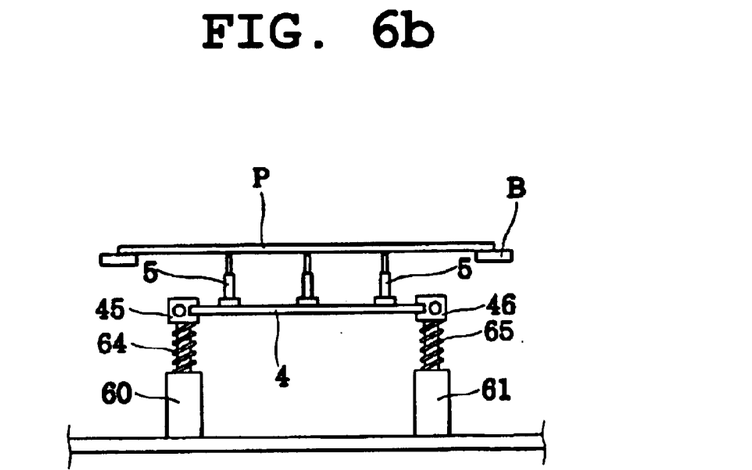

FIG. 3 is a perspective view illustrating an up/down apparatus of a back-up plate according to the present invention. FIG. 4 is a perspective view illustrating a state that a back-up plate is mounted to an up/down apparatus of a back-up plate according to the present invention. FIGS. 5 to 6 are side views illustrating operating states of an up/down apparatus of a back-up plate according to the present invention. In the following description, same drawing reference numerals of FIGS. 1 and 2 are used for the same elements even in different drawings.

The back-up plate according to the present invention comprises: a base plate 10; a first driving cylinder 20 installed on an upper surface of the base plate 10; and a second up/down means moved upwardly and downwardly by the first driving cylinder 20 and for moving a back-up plate 4 upwardly and downwardly by a driving force by itself.

The first driving cylinder 20 and the second up/down means are constructed as one set and then installed to both sides of the base plate 10, respectively.

Oil pressure and pneumatic cylinders etc. can be used as the first driving cylinder 20.

The second up/down means comprises: a second driving cylinder 40 arranged at an upper side of the base plate 10 horizontally, fixed at an upper end of the first driving cylinder 20, and having a rod 41 withdrawn/inserted from/to both sides thereof; rotation links 50 and 51 fixed rotatably to both sides of the one rod 41 centering on the second driving cylinder 40 by means of connection members 43a and 44a and fixed rotatably to both sides of the other rod 41 connected between connection members 43b and 44b.

In order to be ascended/descended the back-up plate 4 without distortion, the opposite rotation links 50 and 51 are fixed to both ends of rotation shafts 52 and 53 and rotated together with the rotation shafts 52 and 53. The both ends of rotation shafts 52 and 53 are inserted to the fixing blocks 54 and 55 rotatably.

Keys 52a and 53a for clamping the rotation shafts 52 and 53, in order not to be idle, are installed to both ends of the rotation shafts 52 and 53 and a connection portion of the rotation links 50 and 51, respectively.

Holders 45 and 46 for fixing the back-up plate 4 are coupled slidably at the rod 41 positioned oppositely to the second driving cylinder 40.

Guide blocks 60 and 61 for guiding the vertical direction movement of the back-up plate 4 are installed to four positions such as front, rear, right and left of the upper surface of the base plate 10. Ball bushes 60a and 61a and rods 62 and 63 inserted to the inside of the ball bushes 60a and 61a are installed to the inside of the guide blocks 60 and 61.

Buffer springs 64 and 65 are installed between the guide blocks 60 and 61 and holders 45 and 46.

As shown in FIG. 4, a first sensor S1 is installed to an end of one side of the back-up plate 4 and a second sensor S2 for sensing the up/down states of the back-up plate 4 together with the first sensor S1 is installed to the rod 41.

The operation of the up/down apparatus of the back-up plate according to the present invention will be described as follows.

As shown in FIGS. 5a and 5b, before the transfer of the board to the mounting area of the electronic components, the back-up plate 4 is positioned at the down state in order not to be interrupted the transfer of the board by a back-up pin 5.

As shown in FIGS. 6a and 6b, when the board P is transferred to the mounting area of the electronic components by a belt B, the back-up plate 4 is ascended, so that the back-up pin 5 is contacted with the bottom surface of the board P and the board P is supported.

By the up/down apparatus of the back-up plate according to the present invention, as shown in FIGS. 6a and 6b, the first driving cylinder 20 is operated until a constant height and the back-up plate 4 is continuously ascended by the second driving cylinder 40 and then controlled minutely.

By the second driving cylinder 40, the rod 41 within the cylinder 40 is moved toward a direction and the rotation links 50 and 51 together with the rotation shafts 52 and 53 are rotated by the rod 41, respectively.

As the rod is ascended, the back-up plate 4 connected by means of holders 45 and 46 is also ascended. The holders 45 and 46 are installed to the rod 41 slidably and when the rod 41 is ascended and moved horizontally, the holders 45 and 46 are ascended from the present position and so the back-up plate 4 is ascended vertically without changing the horizontal position.

As shown in FIG. 6b, when ascending the back-up plate 4, the back-up plate 4 is ascended gradually by the rods 62 and 63 connected to the inside of the guide blocks 60 and 61 through the ball bushes 60a and 61a. By this, when ascending the back-up plate 4, noise does not occurred and the back-up plate 4 dose not dash to the bottom surface of the board P.

As ascending the back-up plate 4, the rod 41 is moved and the second sensor S2 is approached to the first sensor S1, so when values obtained from the first and second sensor S1 and S2 are changed, the ascending of the back-up plate 4 is sensed based on the values. The second sensor S2 may include a movable member and a sensor dog (SD). Relative movement between the moveable member and the sensor dog SD would be sensed to provide an indication of movement of the back-up plate. When the back-up pin 5 supports the board P, the operation of the driving cylinder 20 is stopped and then the ascending of the back-up plate 4 is stopped.

On the other hand, when completing the mounting work of the electronic components, the back-up plate 4 is moved downwardly in order not to be interrupted the back-up pin when transferring the board P. For moving the back-up plate 4 downwardly, when the driving cylinder 20 is operated, the rod 21 is inserted to the inside of the driving cylinder 20 and so the second driving cylinder 40 is ascended together with the rod 21.

When descending the second driving cylinder 40, the rod 41 of the inside of the cylinder 40 is moved horizontally as the opposite of the ascending and the rotation links 50 and 51 are rotated together with the rotation shaft 52 and 53. Because the rotation links 50 and 51 of both ends of the cylinder 41 are connected through the rotation shaft 52 and 53 each other, so their rotation degrees are identical and the back-up plate 4 is descended without distortion.

As shown in FIG. 5b, when descending the back-up plate 4, the back-up plate 4 is gradually descended by the rods 62 and 63 connected to the inside of the guide blocks 60 and 61 by means of ball bushes and buffer springs 64 and 65. By this, when descending the back-up plate, noise does not occurred and the back-up plate 4 does not dash with a structure at its lower side.

Embodiment 2

Figure 7:
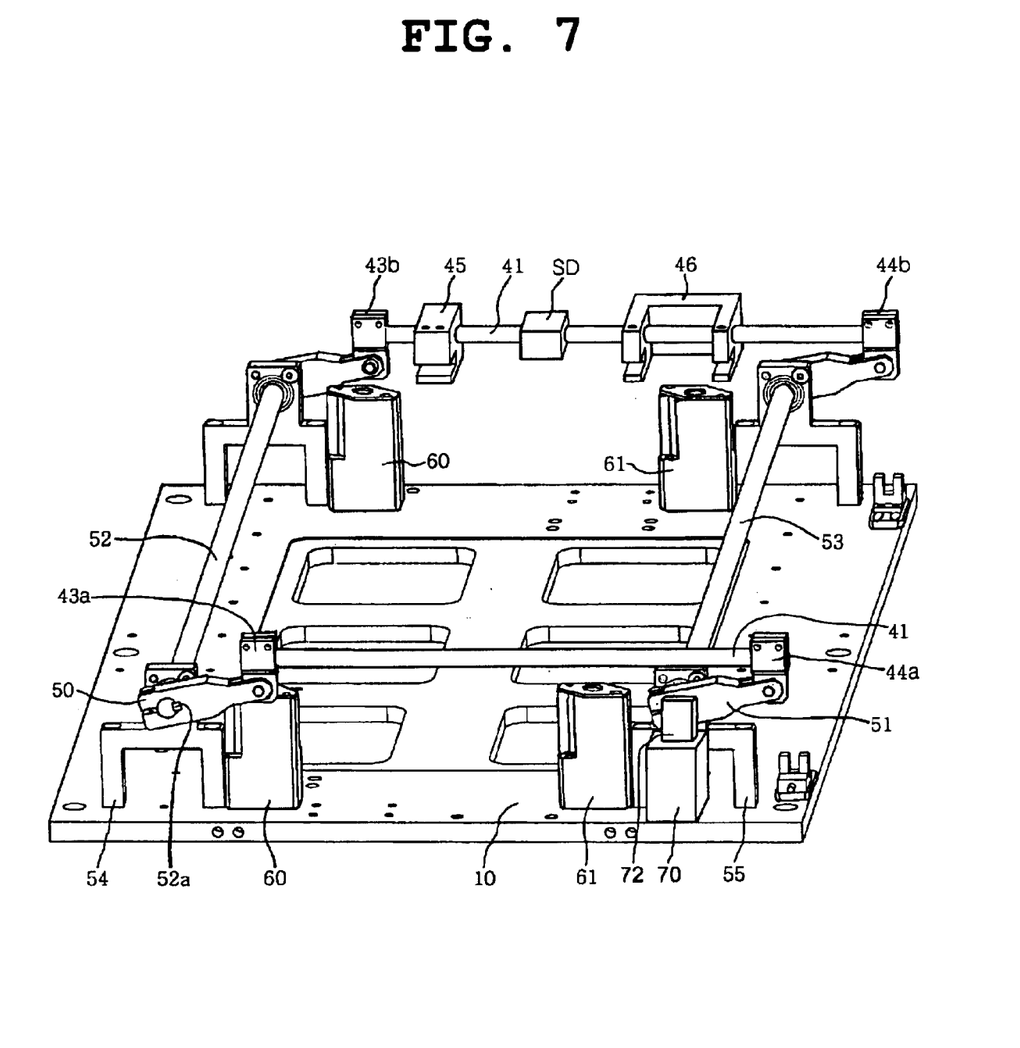
FIG. 7 is a view illustrating another embodiment of a driving source applied to an up/down apparatus of a back-up plate according to the present invention.

FIG. 7 is a side view illustrating second embodiment applied to an up/down apparatus of a back-up plate according to the present invention. As shown in FIG. 7, for ascending the rod 41 connected to the rotation links 50 and 51, a coupling 72 is connected to the rotation shaft 52 and 53 and a stepping motor 70 is connected to the coupling 72.

When driving the motor 70, the back-up plate 4 is ascended by rotating the rotation links 50 and 51 and at this time, the driving of the stepping motor 70 is stopped by a stopper(not shown) and so the height of the back-up plate 4 can be controlled.

On the other hand, without applying the stopper, the height of the back-up plate 4 can be controlled such that when the stepping motor 70 is overloaded, the stepping motor 70 is stopped.

The construction and up/down operations of the back-up plate 4 are the same as those of the first embodiment and so will be omitted.

Accordingly, without application a driving cylinder 20, by applying a motor 70, the back-up plate 4 can be ascended/descended.

As discussed earlier, according to the up/down apparatus of the back-up plate of the present invention, the back-up plate can be maintained in parallel and ascended/descended without rocking, so noise does not occurred, thereby the reliability of the up/down apparatus can be enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A back-up plate up/down apparatus for supporting a printed circuit board comprising:
    a base plate;
    a plurality of guide blocks installed on the base plate;
    at least one first driving means installed between the guide blocks;
    a plurality of fixing blocks installed on the base plate, wherein a rotating shaft is installed between each respective pair of the fixing blocks;
    a plurality of rotating links, wherein a first end of each rotating link is coupled to a respective rotating shaft;
    a plurality of connecting members and wherein a second end of each rotating link is coupled to a respective connecting member;
    a second driving means comprising an extendable rod, wherein the extendable rod is connected to one of the connecting members;
    a plurality of holders coupled to respective ones of the connecting members and configured to hold a back-up plate; and
    a plurality of sensors configured to sense movement of a backup plate held by the holders.

2. The back-up plate up/down apparatus for supporting a printed circuit board in accordance with claim 1, wherein each of the guide blocks comprises a bushing and a rod inserted inside of the bushing respectively.

3. The back-up plate up/down apparatus for supporting a printed circuit board in accordance with claim 1, wherein the first and second driving means are pneumatic cylinders.

4. The back-up plate up/down apparatus for supporting a printed circuit board in accordance with claim 1, wherein each of the rotating links has a key installed between the rotating link and a corresponding rotating shaft to prevent the rotating link from rotating relative to the shaft.

5. The back-up plate up/down apparatus for supporting a printed circuit board in accordance with claim 1, wherein the plurality of sensors comprise first and second sensors and wherein the second sensor has a sensor dog for sensing the position of a movable member installed to a side thereof.

6. A back-up plate up/down apparatus for supporting a printed circuit board, comprising:

a base plate;

at least one first driving means coupled to the base plate;

a plurality of fixing blocks installed on the base plate;

a rotating shaft installed between respective pairs of each of the fixing blocks;

a plurality of rotating links, wherein a first end of each rotating link is coupled to an end of a respective rotating shaft a plurality of connecting members, wherein each connecting member is connected to a second end of a respective rotating link;

a second driving means comprising an extendable shaft, wherein the extendable; shaft is connected to one of the connecting members;

a plurality of holders coupled to respective ones of the connecting members and configured to hold a back-up plate; and a plurality of sensors configured to sense movement of a back-up plate held by the holders.

7. The back-up plate up/down apparatus for supporting a printed circuit board in accordance with claim 6, further comprising a plurality of guide blocks, wherein each guide block 10 comprises a bushing and a rod inserted inside of the bushing.

8. The back-up plate up/down apparatus for supporting a printed circuit board in accordance with claim 6, wherein each rotating link comprises a key installed between the rotating link and a respective rotating shaft to prevent the rotating link from rotating relative to the rotating shaft.

9. The back-up plate up/down apparatias for supporting a printed circuit board in accordance with claim 6, wherein the plurality of sensors comprise first and second sensors and the second sensor has a sensor dog for sensing the position of a movable member installed to a side thereof.

* * * * *